US012568675B2

(12) United States Patent
Ju et al.

(10) Patent No.: US 12,568,675 B2
(45) Date of Patent: Mar. 3, 2026

(54) MANUFACTURING METHOD OF SEMICONDUCTOR STRUCTURE

(71) Applicant: United Semiconductor (Xiamen) Co., Ltd., Xiamen (CN)

(72) Inventors: Rui Ju, Shamen (CN); Hongxu Shao, Singapore (SG); Jinjian Ouyang, Xiamen (CN); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 430 days.

(21) Appl. No.: 18/138,718

(22) Filed: Apr. 24, 2023

(65) Prior Publication Data

US 2024/0304498 A1 Sep. 12, 2024

(30) Foreign Application Priority Data

Mar. 8, 2023 (CN) .......................... 202310216776.6

(51) Int. Cl.
H10D 84/01 (2025.01)
H10D 84/03 (2025.01)
H10D 84/85 (2025.01)

(52) U.S. Cl.
CPC ......... H10D 84/017 (2025.01); H10D 84/038 (2025.01); H10D 84/85 (2025.01)

(58) Field of Classification Search
CPC .......................... H10D 84/013; H10D 84/0191
See application file for complete search history.

(56) References Cited

U.S. PATENT DOCUMENTS

| | | |
|---|---|---|
| 8,482,063 B2 | 7/2013 | Lin |
| 8,507,981 B2 | 8/2013 | Chen |
| 8,729,599 B2 | 5/2014 | Chang |
| 8,742,498 B2 | 6/2014 | Chien |
| 9,093,296 B2 | 7/2015 | Kao |
| 10,217,639 B1 * | 2/2019 | Lee ...................... H10D 84/038 |

* cited by examiner

*Primary Examiner* — Fernando L Toledo
*Assistant Examiner* — Adam S Bowmen
(74) *Attorney, Agent, or Firm* — Winston Hsu

(57) ABSTRACT

The invention provides a method for manufacturing a semiconductor structure, which comprises the following steps: a high voltage metal oxide semiconductor (HVMOS) is provided, the high voltage metal oxide semiconductor comprises a substrate, and the substrate comprises an NMOS region and a PMOS region, the NMOS region and the PMOS region each comprise an oxide layer, a P-type ion doping step on the PMOS region is performed, the thickness of the oxide layer of the PMOS region is reduced during the P-type ion doping step, and an N-type ion doping step is then performed on the NMOS region after the P-type ion doping step, the thickness of the oxide layer of the NMOS region is reduced during the N-type ion doping step.

11 Claims, 3 Drawing Sheets

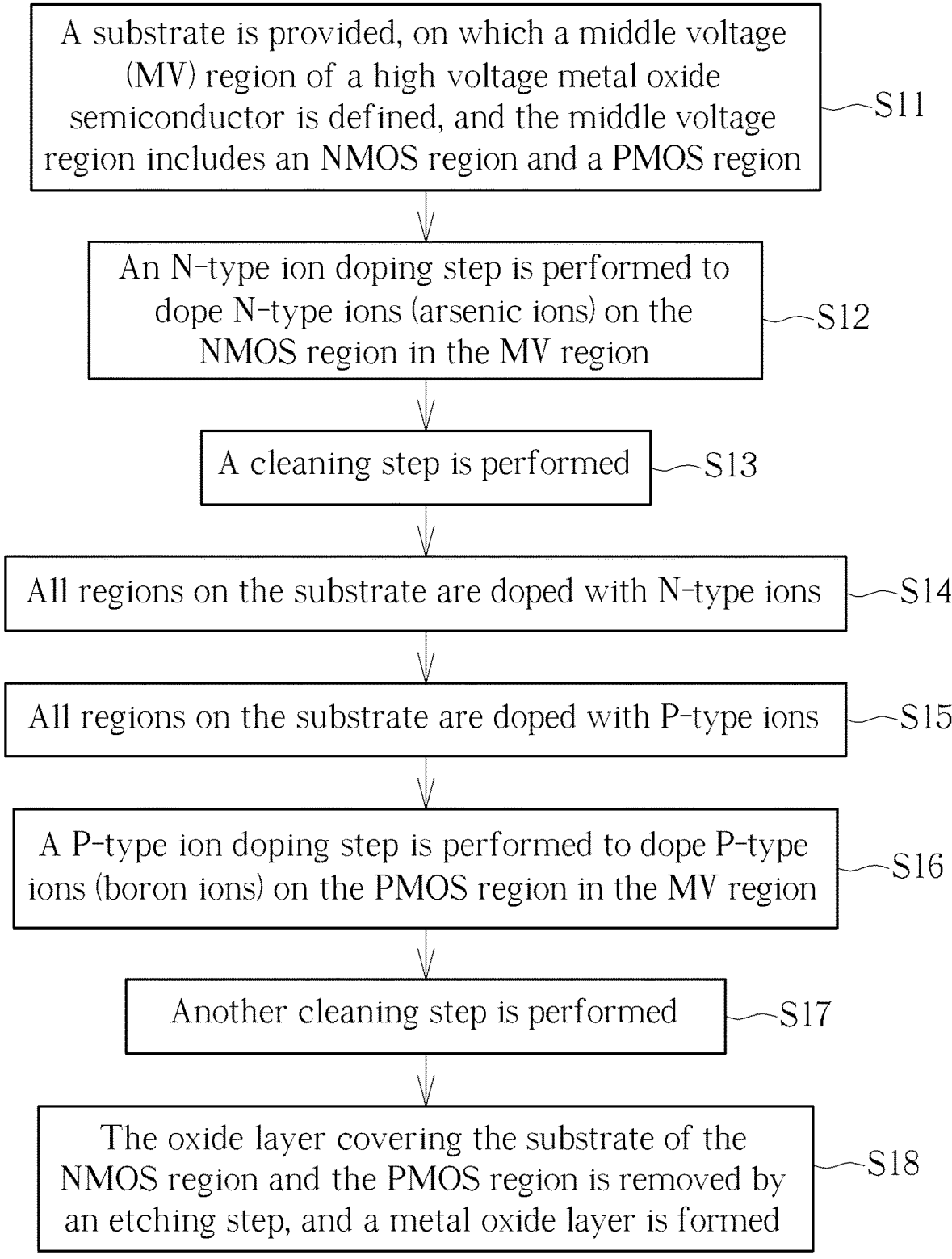

A substrate is provided, on which a middle voltage (MV) region of a high voltage metal oxide semiconductor is defined, and the middle voltage region includes an NMOS region and a PMOS region ——S11

An N-type ion doping step is performed to dope N-type ions (arsenic ions) on the NMOS region in the MV region ——S12

A cleaning step is performed ——S13

All regions on the substrate are doped with N-type ions ——S14

All regions on the substrate are doped with P-type ions ——S15

A P-type ion doping step is performed to dope P-type ions (boron ions) on the PMOS region in the MV region ——S16

Another cleaning step is performed ——S17

The oxide layer covering the substrate of the NMOS region and the PMOS region is removed by an etching step, and a metal oxide layer is formed ——S18

FIG. 1

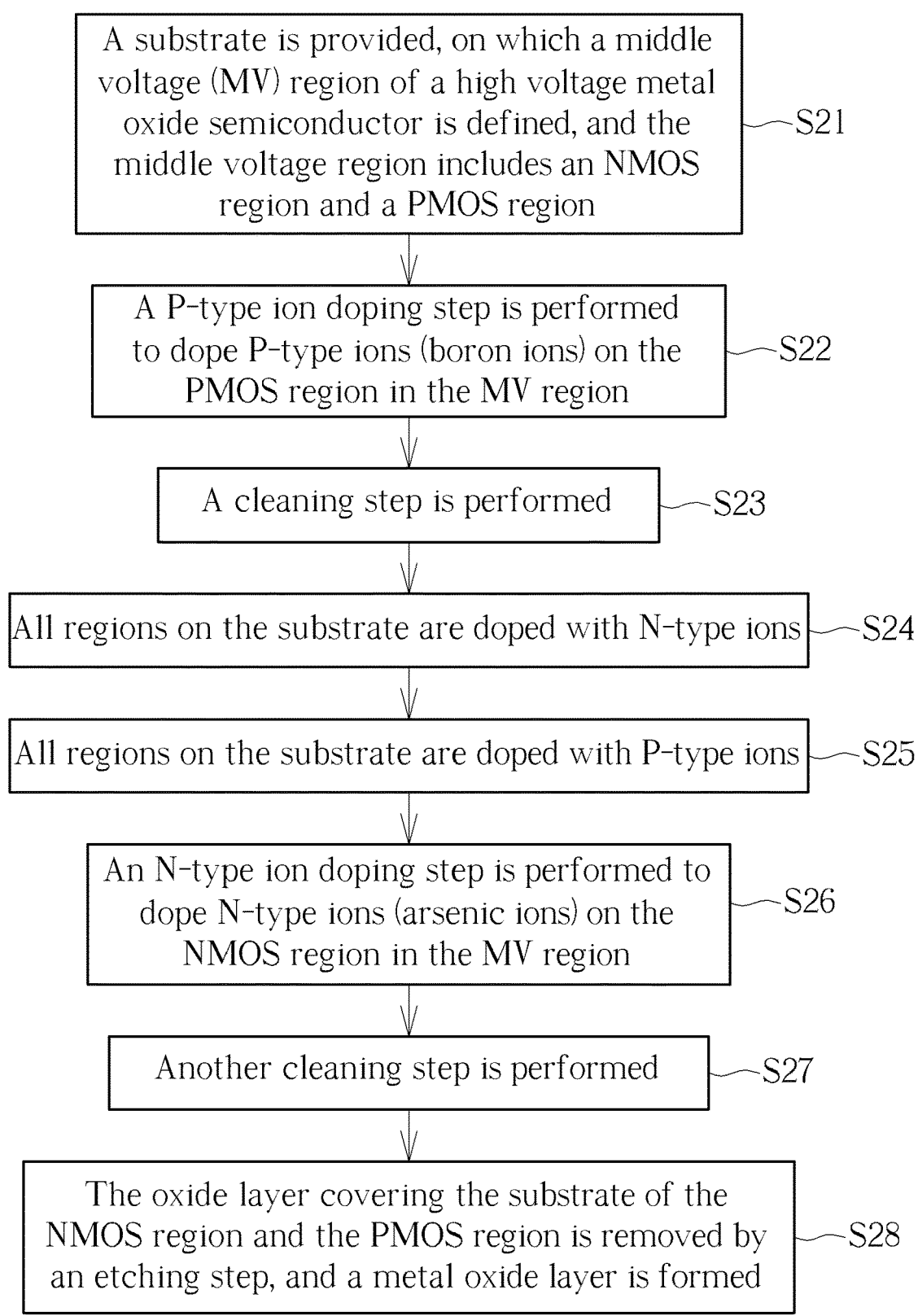

A substrate is provided, on which a middle voltage (MV) region of a high voltage metal oxide semiconductor is defined, and the middle voltage region includes an NMOS region and a PMOS region — S21

A P-type ion doping step is performed to dope P-type ions (boron ions) on the PMOS region in the MV region — S22

A cleaning step is performed — S23

All regions on the substrate are doped with N-type ions — S24

All regions on the substrate are doped with P-type ions — S25

An N-type ion doping step is performed to dope N-type ions (arsenic ions) on the NMOS region in the MV region — S26

Another cleaning step is performed — S27

The oxide layer covering the substrate of the NMOS region and the PMOS region is removed by an etching step, and a metal oxide layer is formed — S28

FIG. 4

MANUFACTURING METHOD OF SEMICONDUCTOR STRUCTURE

BACKGROUND OF THE INVENTION

1. Field of the Invention

The present invention relates to the field of semiconductor manufacturing, in particular to a process improvement of middle voltage (MV) region of high voltage metal oxide semiconductor (HVMOS) to achieve the effects of reducing leakage current and improving quality.

2. Description of the Prior Art

The semiconductor integrated circuit (IC) technology has undergone rapid growth. During the development of ICs, component density has generally increased while chip size has continuously decreased. This process of reducing chip size has benefits in improving production efficiency and reducing associated costs. However, the reduction in chip size has also increased the complexity of processing and manufacturing ICs. Therefore, to achieve technological advancements, continuous development is urgently needed in IC manufacturing.

Embedded high voltage (eHV) technology, based on logic CMOS technology, is used to manufacture various display driver ICs. It plays a critical role in various display panels, including LCDs, organic light-emitting diodes (OLEDs), as well as emerging micro-LED and micro-OLED displays.

Metal-oxide-semiconductor field-effect transistor (MOSFET) is a type of field-effect transistor widely used in analog and digital circuits. It consists of a metal-oxide layer on top of a semiconductor material, and can be classified into N-type and P-type MOSFETs depending on the polarity of their channels, commonly referred to as NMOSFET and PMOSFET, or simply NMOS and PMOS.

High voltage metal oxide semiconductor (HVMOS) transistor is a metal-oxide-semiconductor (MOS) device used for high voltage applications, where the voltage can be higher than that supplied to the I/O circuits. HVMOS devices can be used as switches and are widely used in audio output drivers, CPU power supplies, power management systems, AC/DC converters, LCD or plasma TV drivers, automobile electronic components, peripheral devices, small DC motor controllers, and other consumer electronics.

Gate-introduced drain leakage (GIDL), also known as gate-induced drain leakage, has become one of the main causes affecting the reliability and power consumption of small-sized MOS devices. It also has a significant impact on the erase/write operations of storage devices such as Electrically Erasable Programmable Read-Only Memory (EE-PROM). As the manufacturing process continues to advance and device sizes continue to shrink, the reliability issues caused by GIDL current have become increasingly severe. The industry is looking for a method to improve the gate-induced drain leakage of high-voltage MOS transistors.

SUMMARY OF THE INVENTION

The invention provides a method for manufacturing a semiconductor structure, which comprises the following steps: a high voltage metal oxide semiconductor (HVMOS) is provided, the high voltage metal oxide semiconductor comprises a substrate, and the substrate comprises an NMOS region and a PMOS region, the NMOS region and the PMOS region each comprise an oxide layer, a P-type ion doping step on the PMOS region is performed, the thickness of the oxide layer of the PMOS region is reduced during the P-type ion doping step, and an N-type ion doping step is then performed on the NMOS region after the P-type ion doping step, the thickness of the oxide layer of the NMOS region is reduced during the N-type ion doping step.

The present invention provides an improved process for the middle voltage region (MV region), such as an input/output region (also called I/O region) of a high voltage metal oxide semiconductor (HVMOS). In some processes, the NMOS region in the MV region is doped first, and then the PMOS region in the MV region is then doped. However, due to the different atomic mass of the NMOS region and the PMOS region, the thicknesses of the oxide layers of the NMOS region and the PMOS region are reduced in different degrees during the doping step, and the oxide layer in the NMOS region will be thinner than that in the PMOS region in the subsequent structure. The invention is characterized in that in a high voltage metal oxide semiconductor (HVMOS), the PMOS region in the MV region is doped first, and then the NMOS region in MV region is doped. According to the applicant's experimental results, the speed difference of the cleaning step can be used to compensate for the difference in oxide layer thickness in different regions (the NMOS region and the PMOS region) caused by the different atomic mass of doped ions, thus improving the quality of high voltage metal oxide semiconductor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a flowchart showing the steps of a first embodiment of the present invention.

FIG. 4 is a flowchart showing the steps of the second embodiment of the present invention.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIG. 1 is a flowchart showing the steps of a first embodiment of the present invention. As shown in FIG. 1, firstly, as shown in step S11: a substrate is provided, on which a middle voltage (MV) region of a high voltage metal oxide semiconductor is defined, and the middle voltage region includes an NMOS region and a PMOS region. The high voltage metal oxide semiconductor mentioned here is a metal oxide device applied to high voltage, and it may include many different regions, such as core element regions (core region), SRAM regions, input/output regions (I/O region) and so on. According to different applicable voltages, these different regions can be defined as high voltage (HV) region, middle voltage (MV) region and low voltage (LV) region. The input/output region (I/O region) is suitable for moderate voltage, so it is defined as the middle voltage (MV) region of the present invention.

Figure 2:
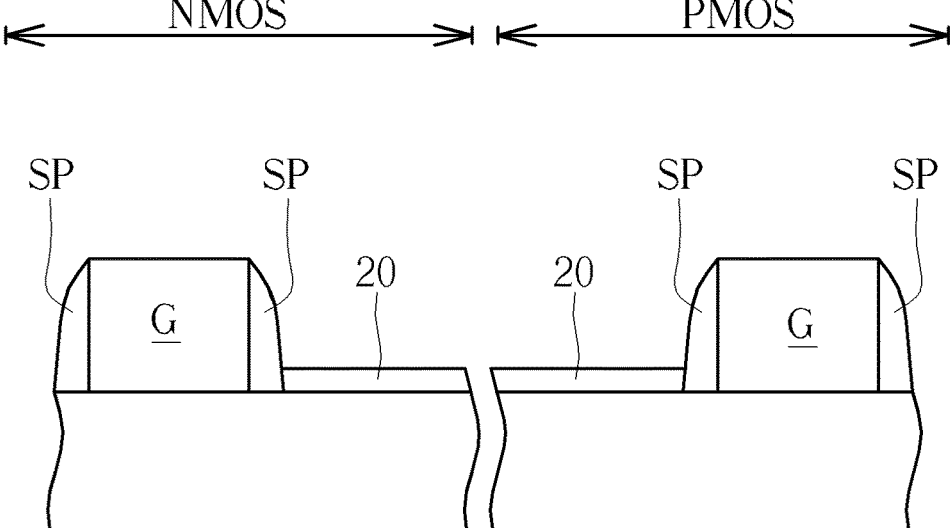
FIG. 2 is a schematic diagram showing the structure of the middle voltage region of a high voltage metal oxide semiconductor before the doping step.

FIG. 2 is a schematic diagram showing the structure of the middle voltage region of a high voltage metal oxide semiconductor before the doping step. As shown in FIG. 2, the MV region includes a substrate 10, and an NMOS region and a PMOS region are defined on the substrate 10 (respectively labeled as "NMOS" and "PMOS" in FIG. 2), which respectively correspond to the NMOS region and the PMOS region mentioned in step S11 of FIG. 1, and also represent different types of MOS regions applied in the MV region of the high voltage metal oxide semiconductor. In which respective gate structures G have been formed in the NMOS region and the PMOS region, and spacers SP may be included beside the gate structure G to protect the sidewall of the gate structure G. Since the materials or formation methods of the gate structure G and the spacer SP belong to the conventional technology in the field, they are not detail described here. In addition, an oxide layer 20, such as, but not limited to, silicon oxide, is formed on the substrate next to the respective gate structures G.

Next, as shown in step S12 of FIG. 1: an N-type ion doping step is performed on the NMOS region in the MV region. In this embodiment, the ions used for doping the NMOS region include arsenic ions, which are doped into the substrate 10 on both sides of the gate structure G of the NMOS region. It is worth noting that when arsenic ions are doped in the NMOS region, the substrate 10 and the oxide layer 20 in the PMOS region will be covered with a photoresist layer (not shown), and only the oxide layer 20 in the NMOS region will be exposed. In addition, during the N-type ion doping step, when arsenic ions are doped into the substrate 10 in the NMOS region, the thickness of the oxide layer 20 in the NMOS region will be reduced. In detail, part of the surface of the oxide layer 20 will be consumed, resulting in a slight decrease in the thickness of the oxide layer 20 in the NMOS region.

Next, as shown in step S13 of FIG. 1, a cleaning step is performed. The main purpose of the cleaning step here is to remove the photoresist layer covering the PMOS region. However, the cleaning step here will cover all regions on the substrate 10, so both the NMOS and the PMOS regions will be cleaned. It is worth noting that although the main purpose of the cleaning step is to remove the photoresist layer, a part of the oxide layer 20 will also be reduced in this process. In addition, according to the experimental results of the applicant, the efficiency of thinning the oxide layer in the doped region (i.e., the NMOS region in this embodiment) is higher than that in other undoped regions (i.e., the PMOS region in this embodiment) during the cleaning step is performed.

As shown in step S14 of FIG. 1: all regions on the substrate are doped with N-type ions, and step S15: all regions on the substrate are doped with P-type ions. These two steps are aimed at other regions on the substrate 10, including the input/output region (the I/O region/the MV region) mentioned here, and the regions such as the core regions and SRAM regions, etc., where N-type ions and P-type ions are respectively doped. Similarly, after the doping step, cleaning steps are also performed to remove the photoresist layer (not shown) on each region. Since the region mainly discussed in the present invention is the MV region, these two steps will not be described in detail.

As shown in step S16 of FIG. 1: a P-type ion doping step is performed on the PMOS region in the MV region. This step is similar to the above step S12, and is also aimed at doping the MV region, but the doping target is the PMOS region, and the doped ion is boron ion. Before the P-type ion doping step is performed, a photoresist layer is formed to cover the NMOS region. It is worth noting that, similar to the above step S12, when the P-type ion doping step is performed, the thickness of the oxide layer 20 in the NMOS region will be reduced when boron ions are doped into the substrate 10 in the NMOS region. In detail, part of the surface of the oxide layer 20 will be consumed, resulting in a slight decrease in the thickness of the oxide layer 20 in the PMOS region.

Next, as shown in step S17 of FIG. 1: another cleaning step is performed. The main purpose of the cleaning step here is to remove the photoresist layer covering the NMOS region. However, the cleaning step here will cover all regions on the substrate 10, so both the NMOS and the PMOS regions will be cleaned. It is worth noting that although the main purpose of the cleaning step is to remove the photoresist layer, a part of the oxide layer 20 will be reduced in the process. As mentioned above, according to the applicant's experimental results, the efficiency of oxide layer thinning in the doped region is higher than that in other undoped regions during the cleaning step is performed. However, until this step, both the NMOS region and the PMOS region have been doped, so the reduction rates of the oxide layer 20 on both regions are almost the same.

Next, as shown in step S18 of FIG. 1: the oxide layer covering the substrate of the NMOS region and the PMOS region is removed by an etching step, and a metal oxide layer is formed. In this step, firstly, the oxide layer 20 covering the substrate 10 in the NMOS region and the PMOS region is removed by a wet etching step to expose the surface of the substrate 10, and then a metal silicide layer is formed on the substrate 10 by a metal silicide process.

Figure 3:
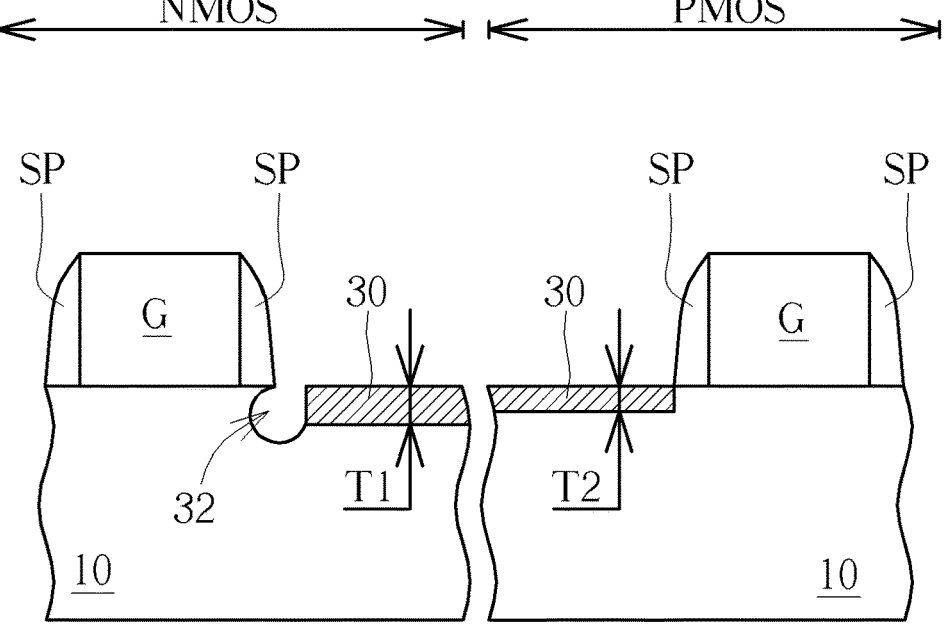
FIG. 3 is a schematic diagram showing the structure of the middle voltage region of a high voltage metal oxide semiconductor after a silicide processing.

FIG. 3 is a schematic diagram showing the structure of the middle voltage region of a high voltage metal oxide semiconductor after silicide processing. As shown in FIG. 3, a metal silicide layer 30 is formed on the substrate 10 next to the gate structure G in the NMOS region and the PMOS region, respectively. Notably, the applicant found that the metal silicide layer 30 in this embodiment may have uneven thickness in the NMOS region and the PMOS region, for example, it is labeled as thickness T1 and thickness T2 respectively, where T1>T2. The reason is that step S12 and step S16 in FIG. 1 described above firstly doping the ions (the arsenic ions) on the NMOS region, and the ions (the boron ions) are then doped on PMOS region. However, since the atomic mass of arsenic is greater than that of boron, the oxide layer 20 on the surface of the substrate 10 will be consumed more by ions with larger atomic mass during the ion doping step, so the oxide layer 20 in the NMOS region will be consumed more than that in the PMOS region. In addition, when the cleaning step is performed as shown in step S13 of FIG. 1, the oxide layer 20 on the surface of the substrate 10 is reduced at a faster rate for the doped region (the NMOS region in this embodiment). Therefore, for the above two reasons, after step S17 is performed, the thickness of the oxide layer 20 in the NMOS region will be thinner than that in the PMOS region. According to the measurement of the applicant, the oxide layer 20 in the NMOS region is less than the oxide layer 20 in the PMOS region by about 10 angstroms. In this case, continuing to form the metal silicide layer 30 will lead to poor quality of the metal silicide layer 30 in the subsequent process, such as uneven thickness of the metal silicide layer 30 formed in the NMOS region and the PMOS region.

More specifically, if the thickness of the oxide layer left on the substrate between the NMOS region and the PMOS region is uneven, when step S18 is performed, after the oxide layer 20 on the substrate 10 is completely removed by the wet etching step, it will lead to two problems: First, in order to completely remove the oxide layer in the PMOS region, the substrate in NMOS region may be over-etched, that is, in addition to removing the oxide layer next to the gate structure G, the wet etching also removes part of the oxide layer directly below the gate structure G and the spacer SP, this will cause higher leakage current or form some under-cut grooves 32 under the spacer SP. On the other hand, if the etching parameters are controlled, so that the oxide layer in NMOS region can just be completely removed, but due to the thicker oxide layer in PMOS region, some oxide layer may remain in the PMOS region, which may affect the formation of subsequent metal silicide layer.

The issue of the uneven thickness of the oxide layer in different regions needs to be solved. There are two main reasons for the uneven thickness of the oxide layer: one is that the consumption of arsenic ions is greater than that of boron ions in the doping step; secondly, the NMOS region is doped first, so after many cleaning steps, the reduced oxide layer is more obvious when it is cleaned. However, in the first embodiment, the reason why the NMOS region is doped first and then the PMOS region is doped is to prevent the PMOS region from being doped with boron ions first, which will cause excessive diffusion of boron ions and affect the electrical properties.

However, the applicant found that in the high voltage metal oxide semiconductor, the influence of leakage current caused by the excessive diffusion of boron ions is almost negligible, so in order to improve the uneven thickness of the oxide layer in different regions, the invention proposes another embodiment. FIG. 4 is a flowchart showing the steps of the second embodiment of the present invention. The difference between this embodiment and the first embodiment mention above is that the order of step S12 and step S16 are exchanged, that is, step S22 in FIG. 4 is equal to step S16 in FIG. 1, and step S26 in FIG. 4 is equal to step S12 in FIG. 1. The remaining steps S21, S23, S24, S25, S27 and S28 in FIG. 4 are respectively equivalent and correspond to steps S11, S13, S14, S15, S17 and S18 in FIG. 1.

In this embodiment, the PMOS region in the MV region (or the I/O region) of the high voltage metal oxide semiconductor is doped first, and then the NMOS region is then doped. In this way, because the PMOS region is doped first, in the next cleaning step (step S13), the removal rate of the oxide layer in the PMOS region will be faster than that in the NMOS region. In this way, the thickness difference of oxide layer between the PMOS region and the NMOS region can be reduced. The remaining steps are the same as those in the above-mentioned first embodiment. After the applicant's experiment, this embodiment has exchanged the doping order of the NMOS and the PMOS regions in the MV region without adding additional steps, but it can reduce the difference of oxide layer thickness in different regions in the MV region, so that the metal silicide layers formed subsequently have almost the same thickness in different regions, and can also avoid the defects such as under-cut grooves caused by over-etching, or incomplete metal silicide formation caused by incomplete oxide layer removal as shown in FIG. 3.

Based on the above description and drawings, the present invention provides a method for manufacturing a semiconductor structure, which comprises providing a high voltage metal oxide semiconductor, wherein the high voltage metal oxide semiconductor comprises a substrate 10, and the substrate 10 comprises an NMOS region and a PMOS region, wherein the NMOS region and the PMOS region each comprise an oxide layer 20 (as shown in step S21 of FIG. 4). A P-type ion doping step is performed on the PMOS region (step S22 in FIG. 4), the oxide layer 20 of the PMOS region is reduced during the P-type ion doping step, and an N-type ion doping step is performed on the NMOS region after the P-type ion doping step (step S26 in FIG. 4), and the oxide layer 20 of the NMOS region is reduced during the N-type ion doping step.

In some embodiments of the present invention, the ions doped in the P-type ion doping step include boron ions.

In some embodiments of the present invention, the ions doped in the N-type ion doping step include arsenic ions.

In some embodiments of the present invention, the thickness of the oxide layer 20 in the NMOS region reduced in the N-type ion doping step is greater than the thickness of the oxide layer 20 in the PMOS region reduced in the P-type ion doping step In some embodiments of the present invention, between the P-type ion doping step and the N-type ion doping step, a first cleaning step (step S23 in FIG. 4) is further performed to reduce the thickness of the oxide layer in the PMOS region.

In some embodiments of the present invention, after the N-type ion doping step, a second cleaning step (step S27 in FIG. 4) is further performed to reduce the thickness of the oxide layers in both the PMOS region and the NMOS region.

In some embodiments of the present invention, after the second cleaning step, a third cleaning step (such as the etching step described in step S28 of FIG. 4) is further performed to completely remove the oxide layer 20 on the surface of the substrate 10 in the NMOS region and the PMOS region, and expose the substrate 10 under the oxide layer 20.

In some embodiments of the present invention, a metal silicide layer 30 is further formed on the substrate 10.

In some embodiments of the present invention, the NMOS region and the PMOS region each include at least one gate structure G.

In some embodiments of the present invention, the NMOS region and the PMOS region each include a plurality of spacers SP located on both sides of the gate structure G.

In some embodiments of the present invention, an under-cut groove 32 is further included below the spacer SP.

In some embodiments of the present invention, the semiconductor structure includes an input/output (I/O) region, and both the NMOS region and the PMOS region are located in the input/output region.

The present invention provides an improved process for the middle voltage region (MV region), such as an input/output region (also called I/O region) of a high voltage metal oxide semiconductor (HVMOS). In some processes, the NMOS region in the MV region is doped first, and then the PMOS region in the MV region is then doped. However, due to the different atomic mass of the NMOS region and the PMOS region, the thicknesses of the oxide layers of the NMOS region and the PMOS region are reduced in different degrees during the doping step, and the oxide layer in the NMOS region will be thinner than that in the PMOS region in the subsequent structure. The invention is characterized in that in a high voltage metal oxide semiconductor (HVMOS), the PMOS region in the MV region is doped first, and then the NMOS region in MV region is doped. According to the applicant's experimental results, the speed difference of the cleaning step can be used to compensate for the difference in oxide layer thickness in different regions (the NMOS region and the PMOS region) caused by the different atomic mass of doped ions, thus improving the quality of high voltage metal oxide semiconductor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:

providing a high voltage metal oxide semiconductor (HV-MOS), wherein the high voltage metal oxide semiconductor comprises a substrate, and the substrate comprises an NMOS region and a PMOS region, wherein the NMOS region and the PMOS region respectively comprise an oxide layer;

performing a P-type ion doping step on the PMOS region, and reducing the thickness of the oxide layer of the PMOS region during the P-type ion doping step; and performing an N-type ion doping step the NMOS region after the P-type ion doping step is performed, and the thickness of the oxide layer of the NMOS region is reduced in the N-type ion doping step, wherein between the P-type ion doping step and the N-type ion doping step, a first cleaning step is further performed to reduce the thickness of the oxide layer in the PMOS region.

2. The method for manufacturing a semiconductor structure according to claim 1, wherein the ions doped in the P-type ion doping step include boron ions.

3. The method for manufacturing a semiconductor structure according to claim 1, wherein the ions doped in the N-type ion doping step include arsenic ions.

4. The method for manufacturing a semiconductor structure according to claim 1, wherein the thickness of the oxide layer in the NMOS region reduced in the N-type ion doping step is greater than the thickness of the oxide layer in the PMOS region reduced in the P-type ion doping step.

5. The method for manufacturing a semiconductor structure according to claim 1, wherein after the N-type ion doping step is performed, a second cleaning step is further performed to simultaneously reduce the thickness of the oxide layer in the PMOS region and the NMOS region.

6. The method for manufacturing a semiconductor structure according to claim 5, wherein after the second cleaning step is performed, a third cleaning step is further performed to completely remove the oxide layer on the surface of the substrate in the NMOS region and the PMOS region, and expose the substrate under the oxide layer.

7. The method for manufacturing a semiconductor structure according to claim 6, further comprising forming a metal silicide layer on the substrate.

8. The method for manufacturing a semiconductor structure according to claim 1, wherein the NMOS region and the PMOS region each comprise at least one gate structure.

9. The method for manufacturing a semiconductor structure according to claim 8, wherein the NMOS region and the PMOS region each comprise a plurality of spacers located on both sides of the gate structure.

10. The method for manufacturing a semiconductor structure according to claim 9, further comprising an under-cut groove under the spacer.

11. The method for manufacturing a semiconductor structure according to claim 1, wherein the semiconductor structure includes an input/output (I/O) region, and both the NMOS region and the PMOS region are located in the input/output region.

\*    \*    \*    \*    \*